US009155232B2

(12) United States Patent
Gasperi

(10) Patent No.: US 9,155,232 B2
(45) Date of Patent: Oct. 6, 2015

(54) WIDE INPUT VOLTAGE RANGE POWER SUPPLY CIRCUIT

(71) Applicant: Michael Gasperi, Milwaukee, WI (US)

(72) Inventor: Michael Gasperi, Milwaukee, WI (US)

(73) Assignee: ROCKWELL AUTOMATION TECHNOLOGIES, INC., Mayfield Height, OH (US)

( * ) Notice: Subject to any disclaimer, the term of this patent is extended or adjusted under 35 U.S.C. 154(b) by 388 days.

(21) Appl. No.: 13/738,628

(22) Filed: Jan. 10, 2013

(65) Prior Publication Data

US 2014/0192571 A1      Jul. 10, 2014

(51) Int. Cl.

| H02M 7/06 | (2006.01) |
|---|---|
| H02H 9/00 | (2006.01) |
| H05K 9/00 | (2006.01) |
| G05F 1/46 | (2006.01) |
| H02M 1/10 | (2006.01) |
| H01H 47/32 | (2006.01) |

(52) U.S. Cl.
CPC ...... H05K 9/00 (2013.01); G05F 1/468 (2013.01); H02H 9/005 (2013.01); H02M 1/10 (2013.01); H01H 47/32 (2013.01)

(58) Field of Classification Search
CPC ......... H02M 1/10; H02M 1/32; H02M 7/062; H02H 9/00; H02H 9/005; H05K 9/00; H01H 47/22; H01H 47/32; H01H 47/325
USPC ................... 363/53; 361/18, 90, 92, 187, 189
See application file for complete search history.

(56) References Cited

U.S. PATENT DOCUMENTS

| 3,535,613 | A | 10/1970 | Katzenstein |
|---|---|---|---|
| 3,777,253 | A | 12/1973 | Callan |
| 4,054,830 | A | 10/1977 | Harrel |
| 4,833,563 | A * | 5/1989 | Russell ........................... 361/92 |
| 5,126,652 | A | 6/1992 | Carlin |
| 5,132,893 | A | 7/1992 | Klein |
| 5,296,800 | A | 3/1994 | Bjorkman et al. |
| 5,615,093 | A | 3/1997 | Nalbant |
| 5,859,756 | A * | 1/1999 | Pressman et al. ................ 361/90 |
| 6,169,391 | B1 | 1/2001 | Lei |
| 6,236,553 | B1 * | 5/2001 | Widell .......................... 361/189 |
| 6,246,597 | B1 | 6/2001 | Peron |
| 6,414,465 | B1 | 7/2002 | Banks et al. |

(Continued)

FOREIGN PATENT DOCUMENTS

CN            101594053         12/2009

OTHER PUBLICATIONS

Albrecht, Jonathan J. et al. "Boost-Buck Push-Pull Converter for Very Wide Input Range Single Stage Power Conversion." IEEE 2005, pp. 303-308.

(Continued)

*Primary Examiner* — Jessica Han
(74) *Attorney, Agent, or Firm* — Quarles & Brady LLP

(57) ABSTRACT

An under voltage lockout circuit configured to set a minimum turn-on voltage for a load is provided. The circuit includes an input terminal configured to receive an input voltage. The circuit includes a first transistor configured to become conductive to supply the input voltage to the load when an input voltage to the under voltage lockout circuit exceeds a threshold, and a second transistor coupled to the first transistor, the second transistor configured to become conductive to supply the input voltage to a first resistor and not to the load when an input voltage to the under voltage lockout circuit falls below the threshold.

20 Claims, 7 Drawing Sheets

(56) References Cited

U.S. PATENT DOCUMENTS

| | | | |
|---|---|---|---|
| 6,583,997 | B1 | 6/2003 | Reid et al. |
| 7,486,030 | B1 | 2/2009 | Biggs |
| 7,557,547 | B2 | 7/2009 | Inagawa et al. |
| 7,576,958 | B2 | 8/2009 | Bergh et al. |
| 7,715,216 | B2 | 5/2010 | Liu |
| 8,203,810 | B2 | 6/2012 | Bryan et al. |
| 8,223,468 | B2 | 7/2012 | Januszewski et al. |
| 2008/0025050 | A1 | 1/2008 | Spindler |
| 2009/0212753 | A1* | 8/2009 | Lou .................... 323/277 |
| 2009/0257159 | A1* | 10/2009 | Imai et al. ............ 361/59 |

OTHER PUBLICATIONS

Alou, P. et al. "Flyback with Active Clamp: a Suitable Topology for Low Power and Very Wide Input Voltage Range Applications." IEEE 2002, pp. 242-248.

Voncina, Danijel et al. "Low Power Multiple Output DC Supply—Part I: Flyback Converter with Wide Input Voltage Range." IEEE 2006, pp. 668-671.

AN2625 Application Note."High AC input voltage limiting circuit." ST Microelectronics 2008, pp. 1-17.

* cited by examiner

WIDE INPUT VOLTAGE RANGE POWER SUPPLY CIRCUIT

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The subject matter disclosed herein relates generally to power supply circuits for a load, and, more particularly, to a power supply circuit that will allow a load, such as a relay, to be operated over a wide input voltage range while providing a reduced current operational threshold.

Many applications exist for switching devices such as relays. In general, such devices typically include one or more contacts that can be opened or closed in response to energization of a relay coil. Both electromechanical and solid state relays are commonly available. Sizes and ratings of such devices vary widely, depending upon the needs of particular applications, and upon such factors as whether the relay powers significant loads or simply provides low-level feedback. Families of relays are currently available that are quite small in physical packaging, and that can be mounted on circuit boards, and other relatively small supports.

One difficulty associated with families of electrical devices such as relays is the large number of catalog numbers and associated relays that need to be manufactured and warehoused. Typically, a relay is designed for only one specific supply voltage. If you are a manufacturer, you want to offer a full product line, which means offering a large variety of relays with installed coils that operate at one supply voltage. If you are an integrator or an OEM, this mean that you need to have available a large selection of relays that operate at different voltages for your application's needs. Attempts to accommodate devices to operate on more than one supply voltage results in increased size, cost, and heat generation.

Another difficulty associated with certain relay applications resides in the presence of leakage current from upstream circuitry used to energize the relay coil. In certain relays, particularly in smaller size relays, such as those mountable on circuit boards and other small support structures, even low levels of leakage current can cause the relay coil to be energized when such energization is not desired, thereby causing the relay to open or close in an undesirable fashion, greatly reducing their reliability. Similarly, such leakage current can cause the coil to remain energized to a sufficient degree to prevent shifting of the contact or contacts upon removal of a control signal to the coil. In either case, the reliability of the relay and the signals produced by the relay can be jeopardized by the leakage current.

To mitigate the problems associated with leakage current, relay control circuits include under-voltage lockout circuits. These circuits are configured to force the relay coil into a non-energized state unless the input voltage exceeds a certain threshold. These lockout circuits, though preventing unwanted energization of the relay coil can be inefficient.

There is a need, therefore, for an improved technique for controlling relays and similar loads. There is a particular need for a power supply circuit that can accept a wide range of input voltages to allow fewer catalog numbers to be required, while at the same time, that can improve reliability by efficiently controlling coil energization based upon an input voltage value.

BRIEF DESCRIPTION OF THE INVENTION

In accordance with one embodiment of the invention, a wide input voltage power supply circuit for a load is provided. The circuit includes a first stage comprising a linear regulator circuit configured to maintain an output voltage at a predetermined output voltage level. The linear regulator includes an input for shutting the linear regulator off when an input voltage exceeds a predetermined shut off threshold. The circuit includes a second stage comprising an under voltage lockout circuit coupled to an output of the linear regulator. The under voltage lockout circuit is configured to set a minimum turn-on voltage for the load and includes a first transistor configured to become conductive to supply the input voltage to the load and not to a first resistor when an input voltage to the under voltage lockout circuit exceeds a threshold, and a second transistor coupled to the first transistor. The second transistor is configured to become conductive to supply the input voltage to the first resistor and not to the load when an input voltage to the under voltage lockout circuit falls below a threshold.

In accordance with one embodiment of the invention, an under voltage lockout circuit configured to set a minimum turn-on voltage for a load includes an input terminal configured to receive an input voltage, a first transistor configured to become conductive to supply the input voltage to the load when an input voltage to the under voltage lockout circuit exceeds a threshold, and a second transistor coupled to the first transistor. The second transistor is configured to become conductive to supply the input voltage to a first resistor and not to the load when an input voltage to the under voltage lockout circuit falls below the threshold.

In accordance with another embodiment of the invention, an under voltage lockout circuit configured to set a minimum turn-on voltage for a load includes an input terminal configured to receive an input voltage, and a voltage divider connected to the input voltage. The voltage divider includes a first and second resistor. The circuit includes a first transistor, a base of the first transistor being connected to the voltage divider, the first transistor being configured to become conductive to supply the input voltage to the load when an input voltage to the voltage divider exceeds a threshold, a second transistor coupled to the first transistor, and a third resistor connected between the input terminal and a collector of the second transistor. The second transistor is configured to become conductive to supply the input voltage to the third resistor and not to the load when an input voltage to the voltage divider falls below the threshold.

To the accomplishment of the foregoing and related ends, the embodiments, then, comprise the features hereinafter fully described. The following description and the annexed drawings set forth in detail certain illustrative aspects of the invention. However, these aspects are indicative of but a few of the various ways in which the principles of the invention can be employed. Other aspects, advantages and novel features of the invention will become apparent from the following detailed description of the invention when considered in conjunction with the drawings.

BRIEF DESCRIPTION OF THE DRAWINGS

The embodiments will hereafter be described with reference to the accompanying drawings, wherein like reference numerals denote like elements, and.

DETAILED DESCRIPTION OF THE INVENTION

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures. The figures depict selected embodiments and are not intended to limit the scope of embodiments of the invention. Skilled artisans will recognize the examples provided herein have many useful alternatives and fall within the scope of embodiments of the invention.

The following description refers to elements or features being "connected" or "coupled" together. As used herein, unless expressly stated otherwise, "connected" means that one element/feature is directly or indirectly connected to another element/feature, and not necessarily electrically or mechanically. Likewise, unless expressly stated otherwise, "coupled" means that one element/feature is directly or indirectly coupled to another element/feature, and not necessarily electrically or mechanically. Thus, although schematics shown in the figures depict example arrangements of processing elements, additional intervening elements, devices, features, components, or code may be present in an actual embodiment.

Embodiments of the invention may be described herein in terms of functional and/or logical block components and various processing steps. It should be appreciated that such block components may be realized by any number of hardware, software, and/or firmware components configured to perform the specified functions. For example, an embodiment may employ various integrated circuit components, e.g., digital signal processing elements, logic elements, diodes, etc., which may carry out a variety of functions under the control of one or more microprocessors or other control devices. Other embodiments may employ program code, or code in combination with other circuit components.

Figure 1:
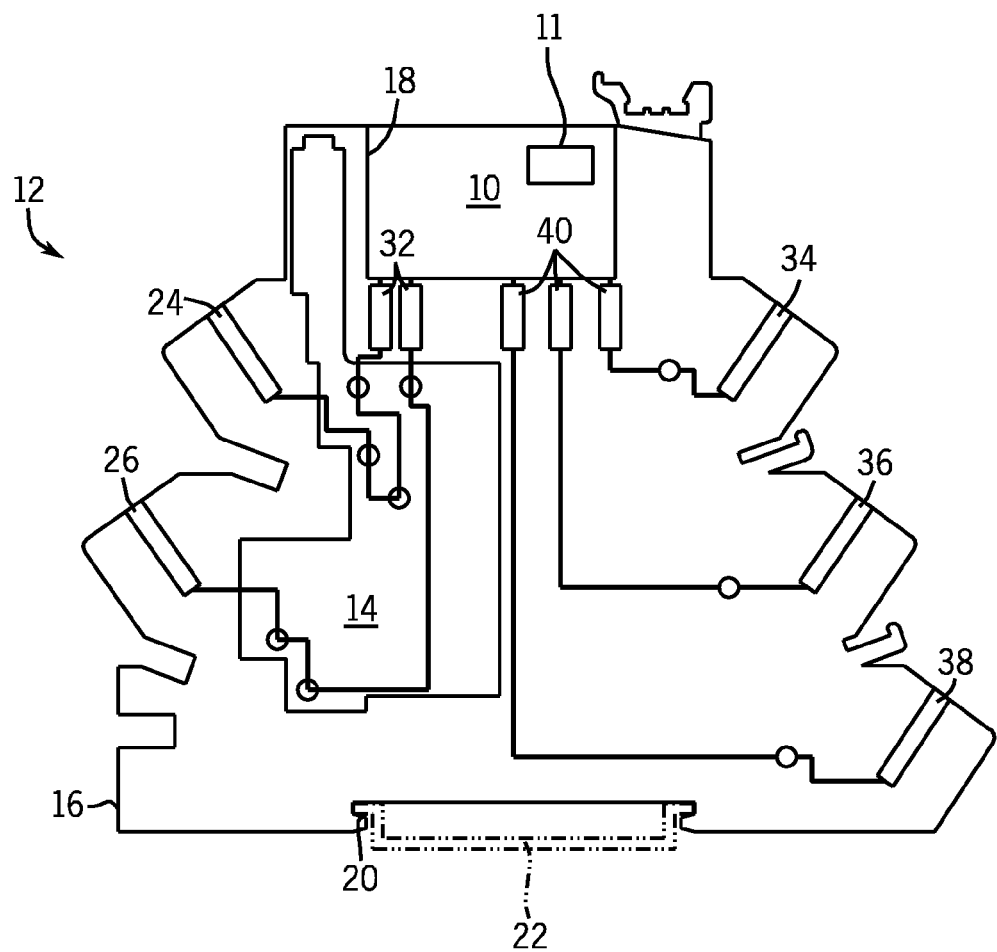
FIG. 1 is a diagrammatical representation of a terminal block incorporating a wide input voltage range power supply according to embodiments of the present invention.

Turning now to the drawings, and referring first to FIG. 1, a relay 10 is illustrated in an exemplary embodiment as being supported on a terminal block 12. Relay 10 may be designed to be received on the terminal block and to receive control signals, and to produce output signals as summarized more fully below. The terminal block 12 may support a circuit board 14 that is designed to provide a control power to the relay and to carryout control functions in accordance with embodiments of the invention.

In the diagrammatical representation of FIG. 1, terminal block 12 is illustrated as including a housing 16 in which the circuit board 14 is mounted. In practice, the circuit board may be covered with a mating housing section or end cap (not shown), where desired. A bay or recess 18 may be provided in an upper section of the terminal block 12 for receiving the relay 10. In the illustrated embodiment, the terminal block 12 is designed to be mounted via a mounting interface 20 at its lower extremity. The mounting interface 20 in the illustrated embodiment may interface with a DIN rail 22 of conventional design.

In the implementation of FIG. 1, the terminal block 12 provides connection points or terminals for control inputs for regulating energization of a coil 11 within relay 10, and for outputting signals from the relay in response to the control input. For example, in the diagrammatical representation of FIG. 1, input terminals 24 and 26, one of which will typically be a neutral input, are provided on a first side of the terminal block housing. As known in the art, the inputs 24 and 26 may be connected to conductive pads on the circuit board 14, and traces may extend on the circuit board and permit interconnection of the inputs with the relay 10. Contacts 32 are designed to route electrical control signals from inputs 24 and 26 to relay 10 for energizing the relay coil 11 as described below.

In addition to inputs 24 and 26, terminal block 12 presents output terminals 34, 36 and 38. The output terminals are designed to provide output signals to downstream circuitry based upon the conductive state of relay 10. The output terminals 34, 36 and 38 are linked to respective contacts 40 which are electrically coupled to relay 10 when inserted in the terminal block housing 16. As will be appreciated by those skilled in the art, output terminals 34, 36 and 38 will typically provide for common, normally-open and normally-closed wiring.

Relay 10 operates in a conventional manner when control signals are applied to it via inputs 24 and 26 and circuit board 14. That is, when electrical current is applied to the relay coil 11, contacts within the relay are closed to provide an output signal at contacts 40 and thereby at output terminals 34, 36 and 38.

While in the present discussion reference is made to a terminal block-mounted relay 10, it should be understood that the embodiments of the invention may be applied to a wide range of circuits and devices, including relays mounted other than on a terminal block. Accordingly, the circuit configuration discussed herein may be applied to circuit board-mountable relays, one or multiple pole relays, as well as relays and other devices having substantially different packaging. In general, embodiments provide a power supply circuit that will allow a load, such as a relay, to be operated over a wide input voltage range while providing a minimum current operational threshold. It should also be noted, that in addition to conventional electromechanical relays, embodiments of the present invention may be equally well employed for solid state relays.

Figure 2:
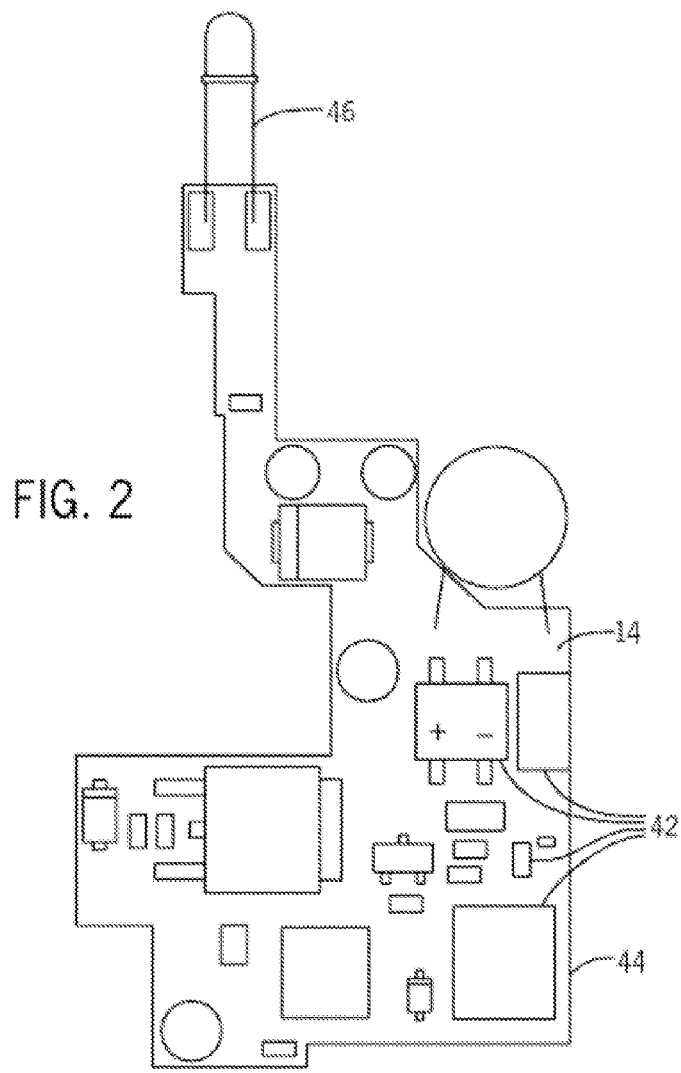
FIG. 2 is an elevational view of a printed circuit board on which a circuit according to embodiments of the present invention may be mounted in a terminal block, such as that illustrated in FIG. 1.

FIG. 2 illustrates an exemplary circuit board configuration on which the power supply circuit described below may be supported. In the embodiment illustrated in FIG. 2, the circuit board 14 may be contoured so as to fit within a portion of a terminal block housing of the type illustrated in FIG. 1. Circuit components 42, for example, are mounted on one or more surfaces of the circuit board 14, and interconnected as described below. A periphery 44 of the circuit board provides a convenient interface for engagement of the circuit board within the support housing 16. However, other alternative mounting structures and schemes may be envisaged. In some embodiments, an extremity of the circuit board may support an LED 46 that provides a visual indication of the conductive state of the circuitry described below. The LED 46 may be made visible at a convenient side or edge surface of the support housing, such as along an upper edge of the terminal block illustrated in FIG. 1.

An exemplary embodiment of a power supply circuit 48 will now be described and is shown in the block diagram of FIG. 3. The power supply circuit 48 can operate one or more small loads, such as a relay coil 11, as a non-limiting example. Embodiments are particularly well-suited to small relay circuits, such as those used in circuit board-mountable or similar relays that have limited heat dissipation capabilities, as non-limiting examples. Moreover, the embodiments may be used for circuits where input signals are applied in either alternating current (AC) or direct current (DC) form. The circuitry can effectively accept a wide range of voltage inputs, with the present embodiments being effective from between about 16 VDC to about 120 VDC, or more specifically between about 24 VDC to about 60 VDC for DC inputs, and between about 19 VAC to about 264 VAC, or more specifically between about 24 VAC to about 240 VAC for AC inputs, although it is to be appreciated that lower and higher voltages are considered. The input range ratio for DC inputs may be about 1 to 8, or about 1 to 3, for example. The input range ratio for AC inputs may be about 1 to 14, or about 1 to 10, for example.

The design of the power supply circuit is particularly challenging due to the limited thermal pathways in not only the relay 10, but in the terminal block 12 as well, and each can only afford a small amount of waste heat before an internal temperature rise becomes excessive. Another challenge for the circuit design was to include a minimum operating current feature so, for example, the relay could be used reliably with triac type PLC outputs that have high leakage current.

The power supply circuit 48 serves both to condition input signals and to regulate application of current to the downstream device, in the illustrated example the relay coil 11. Thus, the circuit 48 is configured to accept a control signal 50, which may be either an AC or a DC signal, providing an input voltage within the input voltage range.

The power supply circuit 48 may include a variety of components including, but not limited to, a signal conditioning circuit 52, a rectifier circuit 54, a linear regulator 56, a high voltage detection circuit 58, an under voltage lockout circuit 60, a capacitor snubber circuit 62, and a load circuit 64. Each will be discussed in greater detail below.

A primary component is the linear regulator 56 that drops the input voltage down to a predetermined lower relay operating voltage. When an AC input is used, the predetermined relay operating voltage averages to be about 24 VDC. When a DC input at or higher than 26 VDC is used, the predetermined operating voltage is about 26 VDC. When a DC input lower than 26 VDC is used, the predetermined operating voltage will generally equal the input voltage. So, the predetermined operating voltage range may be between about 16 VDC and about 26 VDC.

As is known, linear regulators are essentially variable resistors that automatically adjust their value to maintain a constant output voltage. They are simple components but are not efficient when the differential input to output voltage becomes large. Therefore, in this configuration, an input 66 has been added to the linear regulator 56 to turn the linear regulator off on demand. The high voltage detection circuit 58 is shown connected to the input 66 to turn the linear regulator 56 off to prevent the linear regulator from functioning when an AC or DC input voltage exceeds a reasonable shut off threshold for efficient operation. In some embodiments, the predetermined shut off threshold may be between about 100V to about 140V, or more specifically about 120V. This configuration allows the same power FET 68 to be used for both limiting and regulating by separating the functions in time over the course of an input power line cycle. If a DC input voltage above the shut off threshold is applied to the power supply circuit 48, it will simply not operate the coil 11.

Through calculation, it has been found that it would not be possible to perform the entire input voltage regulation with only a single linear regulator because of the excessive heat it would generate.

In the power supply circuit 48, the under voltage lockout circuit 60 is used to regulate application of current to the downstream device, in the illustrated example the relay coil 11. Specifically, the under voltage lockout circuit 60 prevents the coil 11 from operating unless there is a minimum turn-on voltage present, and hence a minimum current draw.

Figure 4A:
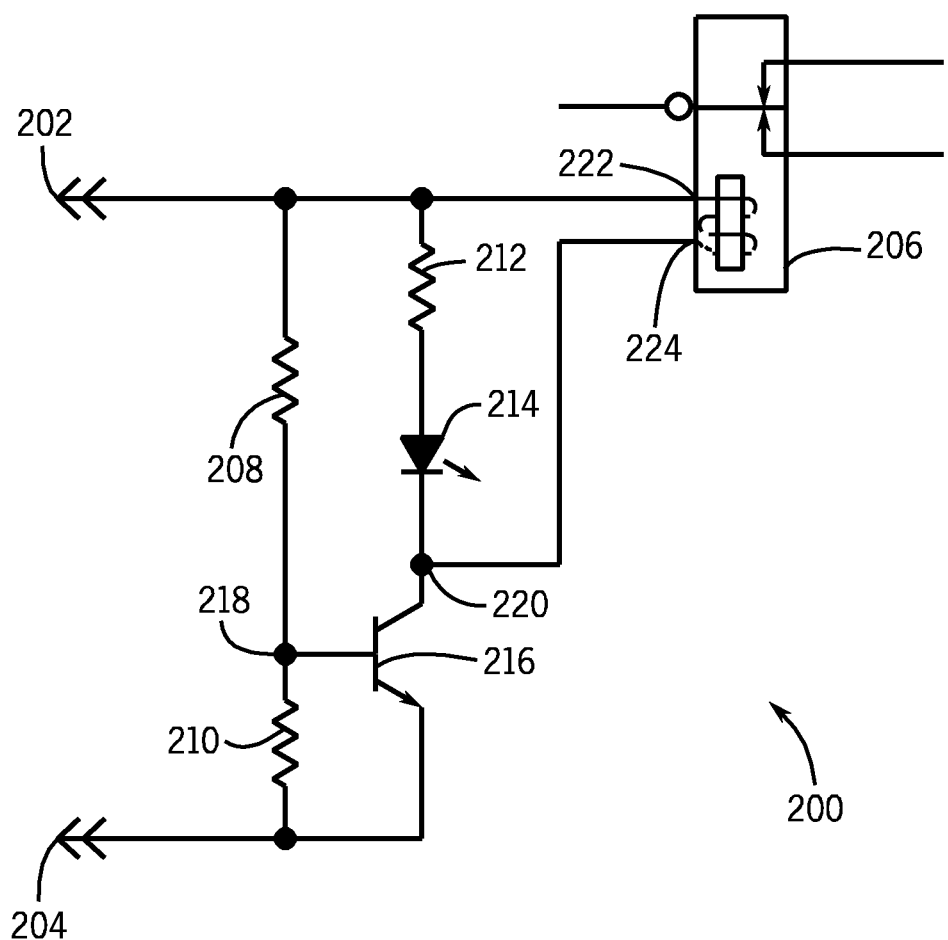
FIGS. 4A and 4B are each circuit diagrams showing under voltage lockout circuits.
Figure 4B:
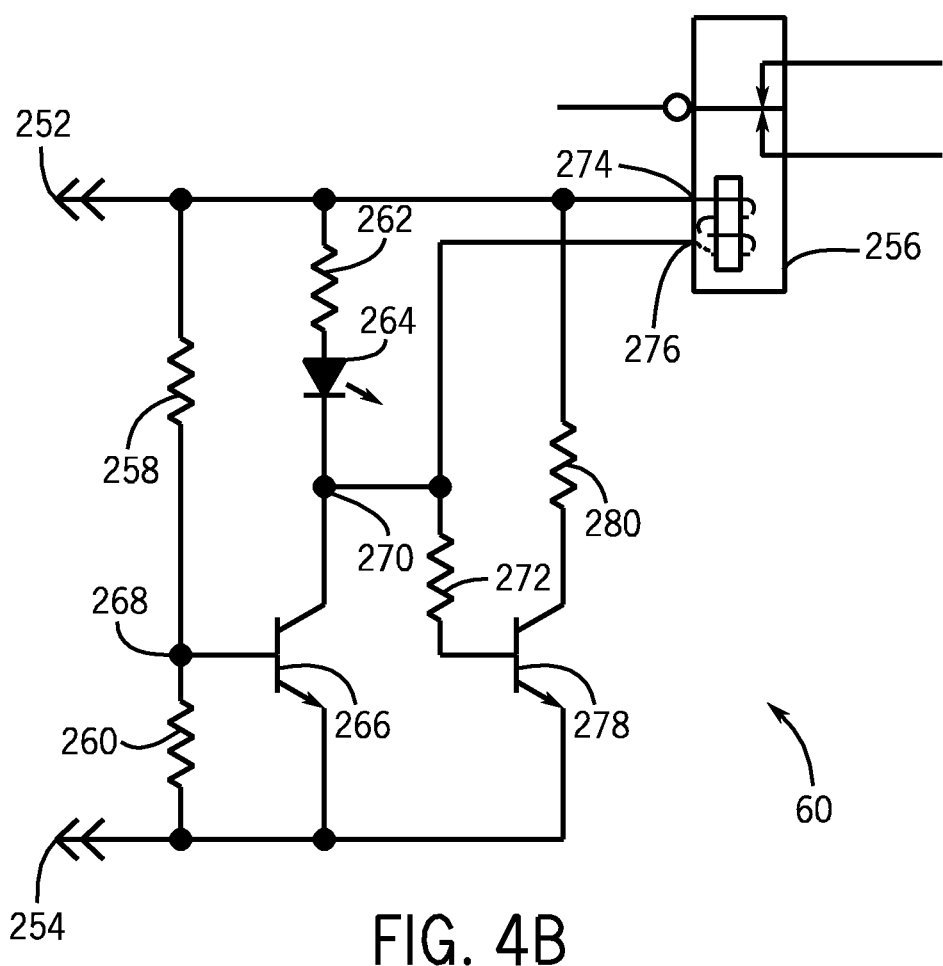

FIGS. 4A and 4B each depict example under voltage lockout circuits. FIG. 4A depicts a prior art circuit, while FIG. 4B depicts the present improved voltage lockout circuit.

In FIG. 4A, the circuit 200 includes input nodes 202 and 204. When an input voltage supplied to the nodes 202 and 204 exceeds a particular threshold value, that voltage is supplied to input terminals 222 and 224 of a relay 206, turning the relay 206 on. The terminals 222 and 224 may be provided, for example, to couple a relay coil of the relay 206 to the circuit 200. When the input voltage across the nodes 202 and 204 falls below that threshold, the relay 206 turns off.

The input node 202 is connected to a resistor 208 which is, in turn, connected to a resistor 210. The resistor 210 is connected to the node 204. The node 218 connecting the resistors 208 and 210 is connected to a base of transistor 216. Accordingly, a voltage at the node 218 controls whether transistor 216 conducts. By selecting an appropriate resistance value for resistor 210, it is possible to select a particular current flowing through the resistor 210 in order that transistor 216 becomes conductive. In one example implementation, the resistance of the resistor 210 is selected so that when a current of approximately 3 milliamps (mA) flows through the resistor 210, transistor 216 becomes conductive.

The collector of the transistor 216 is connected to node 220 and, thereby, the cathode of a light emitting diode (LED) 214. The anode of the LED 214 is connected to a resistor 212. The resistor 212 is connected to the input node 202.

During operation, when the input voltage supplied to the nodes 202 and 204 exceeds the threshold value for the relay 206, sufficient voltage is generated at the node 218 to cause the transistor 216 to turn on. With the transistor 216 turned on, the voltage at the node 220 becomes the same as the voltage at the node 204. The input voltage to the relay 206 is, therefore, the same as the input voltage to the circuit 200, causing the relay 206 to turn on.

At this time, current flows through the resistor 212 and the LED 214, causing the LED 214 to become illuminated. Current also flows through the resistors 208 and 210.

When the voltage across the input nodes 202 and 204 falls below the threshold value, the voltage at the node 218 is not sufficiently high to turn on the transistor 216. As a result, no voltage is generated across the nodes 222 and 224 of the relay 206 causing the relay 206 to turn off.

This mode of operation is quite inefficient. The combination of the resistors 208 and 210 represent a constant resistive load. In both cases, where the relay 206 is turned on or turned off, current flows through the resistors 208 and 210, reducing the efficiency of the circuit 200. Additionally, not only do the resistors 208 and 210 waste power, but the regulator of the power supply must also carry this current, adding to the total losses in the base.

FIG. 4B provides a schematic of the voltage lockout circuit 60. In FIG. 4B, the circuit 60 includes input nodes 252 and 254. When an input voltage supplied to the nodes 252 and 254 exceeds a particular threshold value, that voltage is supplied to input terminals 274 and 276 of a relay 256, turning the relay 256 on. The terminals 274 and 276 may be provided, for example, to couple a relay coil of the relay 256 to the circuit 60. When the input voltage across the nodes 252 and 254 falls below that threshold, the relay 256 turns off.

The input node 252 is connected to a resistor 258 which is, in turn, connected to a resistor 260. The resistor 260 is connected to the node 254. The node 268 connecting the resistors 258 and 260 is connected to a base of transistor 266. Accordingly, a voltage at the node 268 controls whether transistor 266 conducts. By selecting an appropriate resistance value for the resistors 258 and 260, it is possible to select a particular current flowing through the resistor 260 in order that transistor 266 becomes conductive. As such, the resistors 258 and 260 create a voltage divider that defines a threshold voltage for the under voltage detection circuit 60.

In the circuit 60, in contrast to the circuit 200 depicted in FIG. 4A, the resistances of the resistors 258 and 260 can be selected to allow the transistor 266 to turn on at a reasonable voltage. However, in circuit 60 the resistance values of the resistors 258 and 260 can be selected to have much higher values, so that the resistors do not represent a significant load to the circuit 60.

The collector of the transistor 216 is connected to node 270 and, thereby, the cathode of an LED 264. The anode of the LED 264 is connected to a resistor 262. The resistor 262 is connected to the input node 252.

The node 270 is connected to a terminal 276 of the relay 256 and a resistor 272. The resistor 272 is, in turn, connected to a base of a transistor 278. The collector of the transistor 278 is connected, through a resistor 280, to the input node 252 and the terminal 274 of the relay 256. The emitter of the transistor 278 is connected to the input node 254.

During operation, when the input voltage supplied across the nodes 252 and 254 exceeds the threshold value for the relay 256, sufficient voltage is generated at the node 268 to cause the transistor 266 to turn on. With the transistor 266 turned on, the voltage at the node 270 becomes the same as the voltage at the input node 254. The input voltage to the relay 206 across the terminals 274 and 276 is, therefore, the same as the input voltage to the circuit 60, causing the relay 256 to turn on. Accordingly, the input voltage to circuit 60 is supplied to a load (i.e., relay 256) rather than the resistor 280.

At this time, current flows through the resistor 262 and the LED 264, causing the LED 264 to become illuminated. Current also flows through the resistors 258 and 260. However, as discussed above, because the resistances of the resistors 258 and 260 can be selected to be relatively high, the resistors 258 and 260 are only minimal loads upon the circuit 60.

In contrast, when the voltage across the input nodes 252 and 254 falls below the threshold value, the voltage at the node 268 is not sufficiently high to turn on the transistor 266. Because the transistor 266 is not conducting, the node 270 is pulled up to the voltage value of the input node 252 by the resistor 262, which operates as a pull-up resistor. With node 270 pulled-up, the gate of the transistor 278 is pulled-up, causing the transistor 278 to become conductive. As such, transistor 278 is turned on utilizing current through the relay 256. In this configuration, both the nodes 274 and 276 of the relay 256 are at approximately the same voltage and the relay 256 is turned off. The voltage across the input nodes 252 and 254, then, is applied across the resistor 280, creating additional current. The additional current may be used to establish a minimum current flowing when the relay is turned off. In some implementations, the additional current is at a required minimum of approximately 4 mA. In this configuration, therefore, the input voltage is supplied to the resistor 280, rather than the load (i.e., the relay 256).

The under voltage detection circuit depicted in FIG. 4B provides for a more efficient operation than the under voltage detection circuit depicted in FIG. 4A. Because the resistors 258 and 260 are selected to have higher resistance values, the resistors 258 and 260 do not represent a significant load to the circuit. When the input voltage is not sufficient to turn on the relay 256, the resistor 208 is configured to provide extra load current. However, when the relay 256 is energized, the resistor 208 is isolated within the circuit, to reduce the overall load.

Figure 5A:
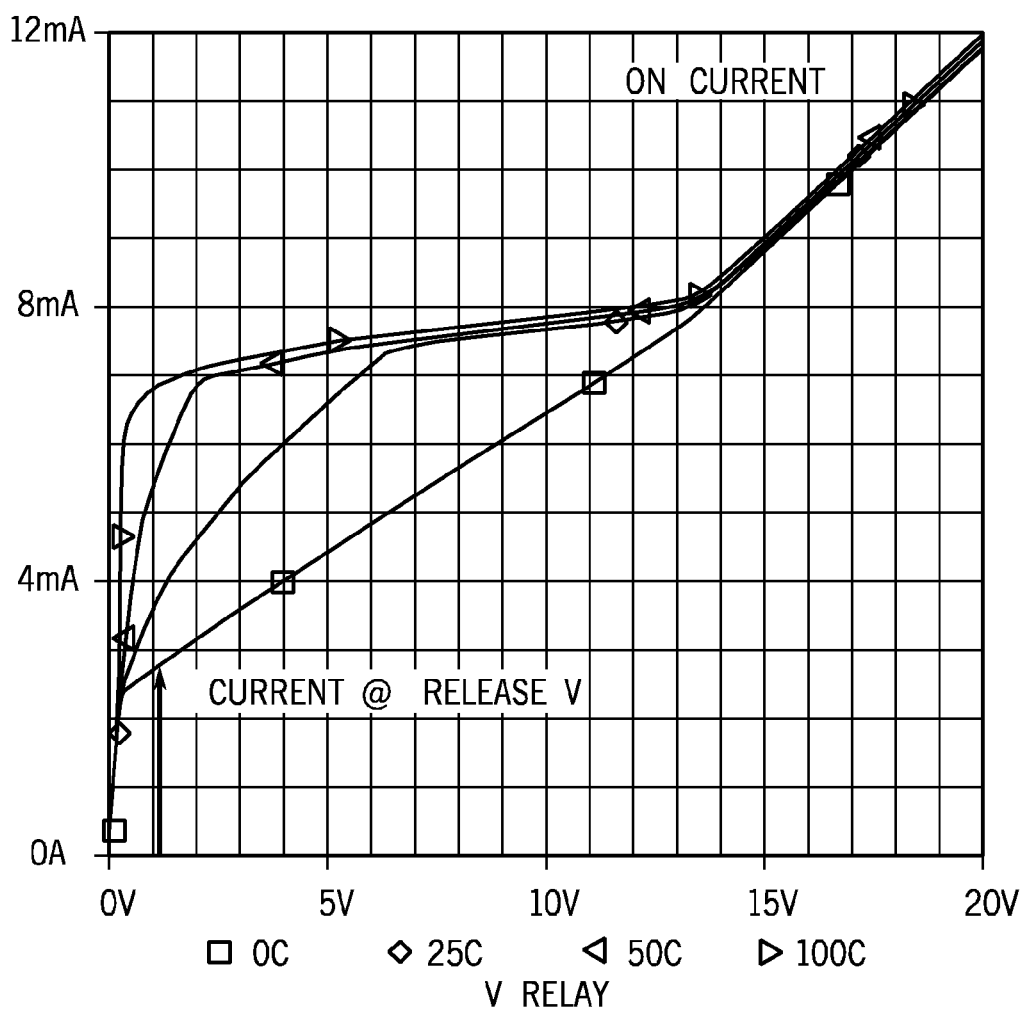
FIGS. 5A and 5B are graphs illustrating a comparison of current consumed versus applied input voltage for the under voltage lockout circuits of FIGS. 4A and 4B, respectively.
Figure 5B:
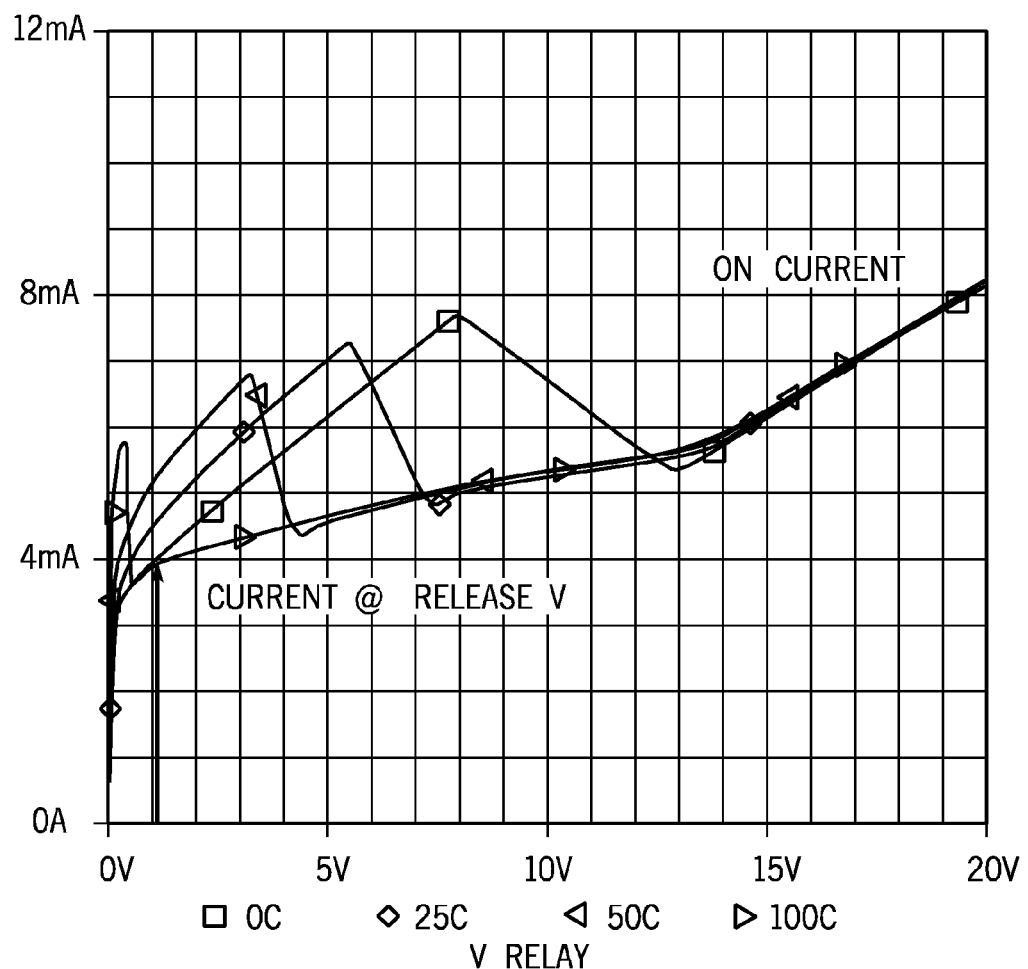

As mentioned above, the circuit 60 presented in FIG. 4B is more efficient than the conventional circuit described in conjunction with FIG. 4A. To illustrate, FIGS. 5A and 5B are graphs illustrating a comparison of current consumed versus applied input voltage. FIG. 5A shows the comparison for the conventional circuit of FIG. 4A, while FIG. 5B shows the comparison for the improved circuit of FIG. 4B.

Each graph includes a number of lines representing the minimum voltage to turn on the transistor (Vbe). Vbe is generally temperature sensitive, so each graph shows a number of curves at different temperatures: 0 Celsius (C), 25 C, 50 C, and 100 C. As illustrated in FIG. 5B, at 0 C Vbe is higher, by approximately 0.8V, but at 100 C Vbe is lower, by approximately 0.5V. As shown, the values provided for the improved circuit in FIG. 5B demonstrate a nearly 30% improvement in efficiency over that of the conventional circuit.

Figure 3:
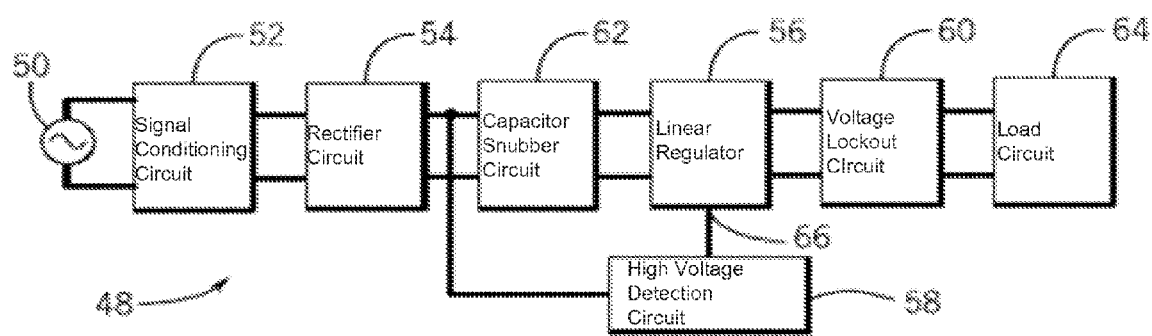
FIG. 3 is a block diagram of a control circuit according to embodiments of the present invention.
Figure 6:
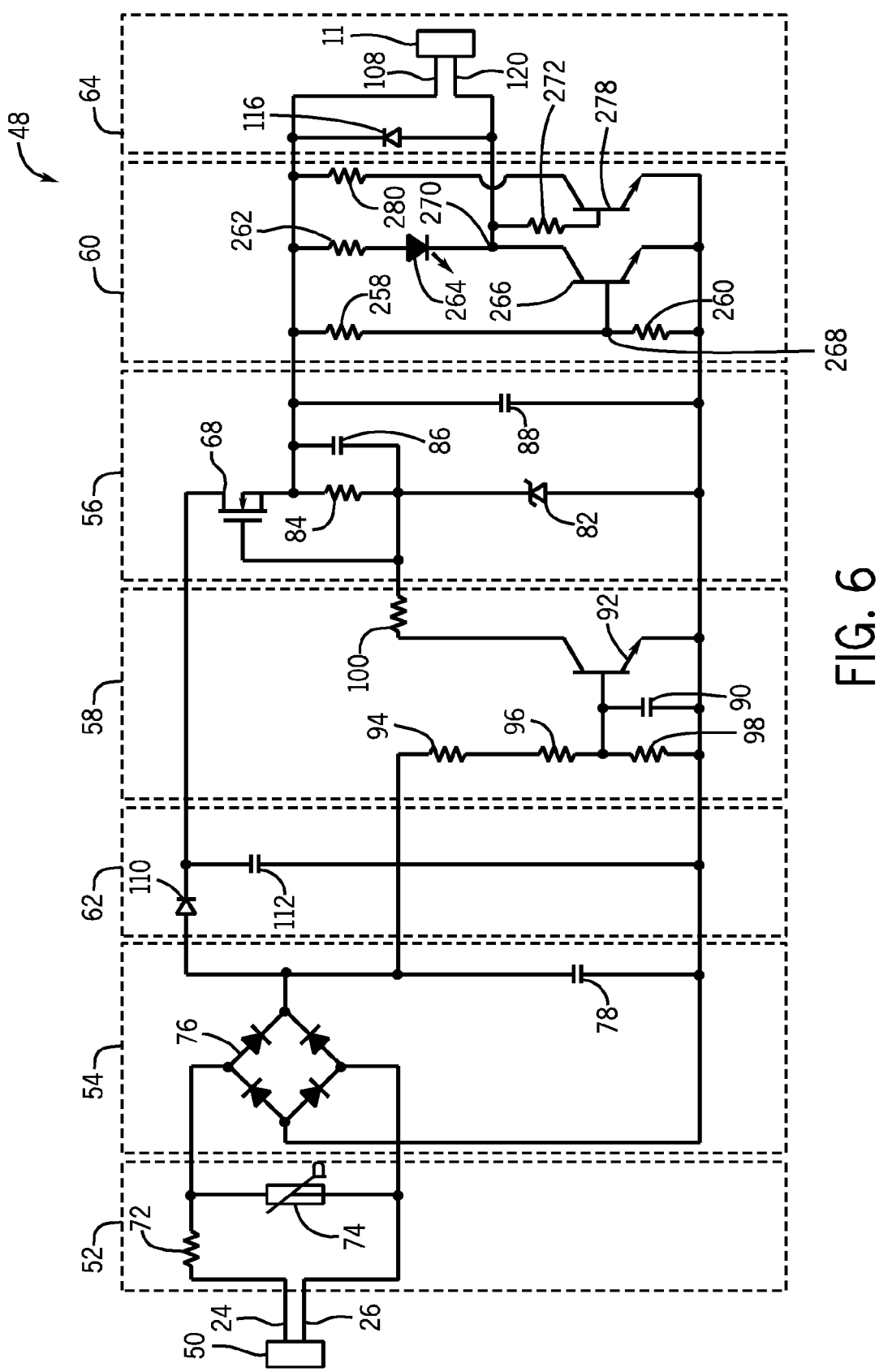
FIG. 6 is a circuit diagram of an exemplary control circuit such as that illustrated in FIG. 3.

FIG. 6 illustrates an exemplary implementation of the functional block diagram illustrated in FIG. 3. The power supply circuit 48 depicted in FIG. 6 incorporates the present improved under voltage detection circuit 60 depicted in FIG. 4B. The configuration of FIG. 6 is particularly adapted to an input voltage rating of between about 16 VDC to about 120 VDC for DC inputs and about 19 VAC to about 264 VAC for AC inputs, although other configurations and ratings can be envisaged. The circuit 48 receives input control signals 50 via lines 24 and 26. In the circuit configuration of FIG. 6, either AC or DC input control signals may be applied. A signal conditioning circuit 52 may include a resistor(s) 72 that limits current through the circuit. For example, a 47 ohm resistor may be used. An MOV 74 may be used to protect the circuitry from over voltage transients, but due to size constraints, it may be a rather low energy device. The resistor 72 in series with the input further absorbs some of the transient energy, and also helps with conducted EMI.

The signal conditioning circuit 52 appropriately regulates the incoming control signal 50 for application to a rectifier circuit 54. Circuit 54 serves to rectify alternating current control signals to produce direct current waveforms. While the rectifier circuit 54 is unnecessary in applications where a direct current input control signal is available, the circuit may be included in all implementations, where desired, to provide for application of either alternating current or direct current input signals.

In some embodiments, the input circuitry may need to rectify an AC input voltage, so a 0.5 A 600V full wave bridge 76, for example, may be used. A capacitor 78 may follow the bridge 76 to limit conducted EMI. In some embodiments, a 500 pF 630V ceramic capacitor, for example, may be used. The value of this capacitor should not be made too large, as it may negatively affect the high voltage detection circuit 58 by excessively smoothing out the AC line voltage.

In some embodiments, the linear regulator 56 may use a depletion mode FET 68. In one example, a DN2470 from Supertex Inc. may be used. This type of FET conducts even when the gate voltage is zero. An advantage of this configuration is that it has no minimum operating voltage and simply passes current when below the predetermined regulated voltage. In an alternative embodiment, an enhancement mode FET may be used, which generally would be less expensive, but it would also additionally drop about 4V before it started to operate. The linear regulator 56 is shown connected basically as a follower where the gate voltage is determined by a 24V zener diode 82.

With the depletion mode FET 68, the gate voltage must be several volts below the source to turn off conduction. The source will rise to the zener voltage minus the gate turn off voltage, which may be about negative 2.5V. This equates to a regulated voltage being about 24V minus a negative 2.5V, or about 26.5V. This is well within the operating range of a 24V relay.

There is essentially no current or heat dissipated in the zener diode 82, although it may need some physical spacing to accommodate higher voltage drops. Because the FET 68 gate doesn't require any current, 100 kOhm, for example, is all that may be needed as a pull-up resistor 84. A capacitor 86 in parallel with the resistor 84 helps the initial rise time when the relay 10 is first switched on. In some embodiments, a 0.01 uF capacitor may be used for capacitor 86. The capacitor 86 also limits the switching speed of the linear regulator 56 and softens any transients when the regulator is switched off and on.

Pulling the voltage on the cathode of the zener diode 82 down effectively makes it look like a lower voltage zener. Because the voltage on bulk capacitor 88 may be around 26.5V, this would turn the FET 68 off when the source voltage drops down to about 2.5V. However, sufficient bulk capacitance in capacitor 88 may be provided, such that the voltage droop, even at 50 Hz, is not more than a few volts. In some embodiments, a 10 uF capacitor may be used for capacitor 88. Capacitor 88 also serves to provide a source of power to the coil 11 while the linear regulator is shut off during portions of the rectified input line voltage, as discussed below.

The high voltage detection circuit 58 depends on a resistor divided version of the rectified input line voltage for exceeding the forward base emitter voltage, typically about 0.6V, of a bipolar transistor 92. Resistor 94 and resistor 96 may be used in series because individually they may not be able to withstand the potentially high voltage that may be dropped across them. For example, a total of about 300 kOhm may be used to keep the power dissipation with a 240 VAC input at 0.1 W per resistor. However, 0.25 W resistors may be used for consideration of thermal derating. Resistor 98 may be sized at about 1.5 kOhm, for example, to make 0.6V occur at about 120V. A capacitor 90 may be provided in parallel with resistor 98 to provide a low-pass filter to reduce noise affecting the high voltage detection circuit 58. Transistor 92 may be a small generic NPN transistor. For example, the 2N3094 by International Rectifier may be used. Coupling the collector of transistor 92 to the cathode of zener diode 82 may work, but it may also cause the gate to source voltage of FET 68 to approach negative 26.5V, which would likely exceed its maximum rating. Resistor 100 may be inserted to reduce this voltage to a lower value. For example, a 100 kOhm resistor may be used to reduce the voltage to about half the voltage value.

As previously discussed, relays may also be used to buffer triac outputs from Programmable Logic Controllers (PLCs). Triacs are known for having off state leakage current in the low milliamp range. Some small general purpose relays have a rated release voltage, and hence current, so low that a triac leakage current can maintain a relay in an energized state even though it is supposed to be turned off. The power supply circuit 48 may include an under voltage lockout circuit 60 to require that a current higher than a triac leakage current is necessary for operation of the coil 11.

The under voltage lockout circuit 60 may be used to keep the coil 11, and indicator LED 264, from operating unless there is a minimum turn-on voltage present, and hence a minimum current draw.

Transistor 266 of under voltage lockout circuit 60 becomes conductive when a resistor-divided version of the output voltage from linear regulator 56 exceeds about a 0.6V threshold. Resistor 258 and resistor 260 provide the voltage divider. Resistor 258 may be sized at about 100 kiloohms (kOhms), for example, and resistor 260 may be sized at about 8.2 kOhms, for example. Transistor 266 may also be a 2N3904 by International Rectifier, for example. Setting this threshold to occur with an output voltage of about 10V would provide that the coil 11 and LED 264 would be drawing at least about 4 mA without effecting the low voltage operation of the coil 11. When the transistor 266 turns on (causing the relay coil 11 to become energized), relay coil 11 is exposed to the output voltage from the linear regulator 56, turning the relay on. Additionally, LED 264 is energized. LED 264 may be provided to provide an indication of the operative state of the device (i.e., powered or unpowered). To adjust the LED brightness, a resistor 262 may be selected to limit the current in the LED 264 to a few mA.

When the output voltage from the linear regulator 56 falls below the threshold value, transistor 266 becomes non-conductive. As discussed above, this causes transistor 278 to become conductive. Transistor 278 may also be a 2N3904 by International Rectifier, for example. The output voltage from the linear regulator 56 then falls across the resistor 280, which provides a suitable load current. In one implementation, the resistance of resistor 280 is approximately 2.7 kOhms. Additionally, in this state, insufficient voltage is supplied to the terminals 108 and 120 of the relay coil 11, causing the relay coil 11 to turn off.

The power input to the relay 10 may have considerable line inductance. A capacitor snubber circuit 62 may be included to divert the current from this inductance when the high voltage detection circuit 58 suddenly turns off the linear regulator 56. A diode 110 may be included to isolate the voltage on a snubber capacitor 112 from the high voltage detection circuit. The value of capacitor 112 should be made as large as practically possible to limit the magnitude of the voltage spike. For a small load, such as the coil 11, a 0.1 uF capacitor, for example, may be used because the input MOV 74 also works to prevent this spike.

In some embodiments, the relay 10 includes a 24 VDC coil 11 with enough inductance that a small flyback diode 116 may be provided by load circuit 64 to divert the current when the under voltage lockout circuit 60 suddenly switches it off.

Finally, terminals 108 and 120 may be provided for coupling the relay coil 11 to the circuit 48. In the embodiment described above, terminals 118, 120 lead to contacts 32 (see FIG. 1) for coupling to the relay.

It is to be appreciated that other factors, such as tolerances, temperature, and altitude, for example, may affect the predetermined values described herein. One of ordinary skill in the art would appreciate that these values may vary depending on a variety of conditions.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Finally, it is expressly contemplated that any of the processes or steps described herein may be combined, eliminated, or reordered. Accordingly, this description is meant to be taken only by way of example, and not to otherwise limit the scope of this invention.

I claim:

1. A wide input voltage power supply circuit for a load, the circuit comprising:
    a first stage comprising a linear regulator circuit configured to maintain an output voltage at a predetermined output voltage level, the linear regulator including an input for shutting the linear regulator off when an input voltage exceeds a predetermined shut off threshold; and
    a second stage comprising an under voltage lockout circuit coupled to an output of the linear regulator, the under voltage lockout circuit configured to set a minimum turn-on voltage for the load and including:
        a first transistor configured to become conductive to supply the input voltage to the load and not to a first resistor when an input voltage to the under voltage lockout circuit exceeds a threshold, and
        a second transistor coupled to the first transistor, the second transistor configured to become conductive to supply the input voltage to the first resistor and not to the load when an input voltage to the under voltage lockout circuit falls below a threshold.

2. The circuit of claim 1, wherein a base of the first transistor is coupled to a voltage divider comprising a second and third resistor.

3. The circuit of claim 2, wherein a resistance of the second resistor is approximately 100 kOhms and a resistance of the third resistor is approximately 8.2 kOhms.

4. The circuit of claim 1, including an LED coupled to a collector of the first transistor to indicate a power status of the circuit.

5. The circuit of claim 1, wherein a base of the second transistor is coupled to a collector of the first transistor.

6. The circuit of claim 1, wherein a resistance of the first resistor is approximately 2.7 kOhms.

7. The circuit of claim 1, wherein the first transistor is configured to become non-conductive when the second transistor is conductive.

8. The circuit of claim 7, wherein the second transistor is configured to become non-conductive when the first transistor is conductive.

9. An under voltage lockout circuit configured to set a minimum turn-on voltage for a load, comprising:
    an input terminal configured to receive an input voltage;
    a first transistor configured to become conductive to supply the input voltage to the load when an input voltage to the under voltage lockout circuit exceeds a threshold; and
    a second transistor coupled to the first transistor, the second transistor configured to become conductive to supply the input voltage to a first resistor and not to the load when an input voltage to the under voltage lockout circuit falls below the threshold.

10. The circuit of claim 9, wherein a base of the first transistor is coupled to a voltage divider comprising a second and third resistor.

11. The circuit of claim 10, wherein a value of the second resistor is approximately 100 kOhms and a value of the third resistor is approximately 8.2 kOhms.

12. The circuit of claim 9, including an LED coupled to a collector of the first transistor to indicate a power status of the circuit.

13. The circuit of claim 9, wherein a base of the second transistor is coupled to a collector of the first transistor.

14. An under voltage lockout circuit configured to set a minimum turn-on voltage for a load, comprising:
    an input terminal configured to receive an input voltage;
    a voltage divider connected to the input voltage, the voltage divider including a first and second resistor;
    a first transistor, a base of the first transistor being connected to the voltage divider, the first transistor being configured to become conductive to supply the input voltage to the load when an input voltage to the voltage divider exceeds a threshold;
    a second transistor coupled to the first transistor; and
    a third resistor connected between the input terminal and a collector of the second transistor, the second transistor configured to become conductive to supply the input voltage to the third resistor and not to the load when an input voltage to the voltage divider falls below the threshold.

15. The circuit of claim 14, wherein the threshold is approximately 16 VDC.

16. The circuit of claim 14, wherein a resistance of the first resistor is approximately 100 kOhms and a resistance of the second resistor is approximately 8.2 kOhms.

17. The circuit of claim 14, wherein a resistance of the third resistor is approximately 2.7 kOhms.

18. The circuit of claim 14, wherein the load is a relay.

19. The circuit of claim 14, including an LED coupled to a collector of the first transistor to indicate a power status of the circuit.

20. The circuit of claim 14, wherein a base of the second transistor is coupled to a collector of the first transistor.

* * * * *